(12) United States Patent
Sutardja

(10) Patent No.: US 7,212,144 B1
(45) Date of Patent: May 1, 2007

(54) FLASH ADC

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 11/384,855

(22) Filed: Mar. 20, 2006

Related U.S. Application Data

(60) Provisional application No. 60/759,869, filed on Jan. 18, 2006, provisional application No. 60/773,029, filed on Feb. 14, 2006.

(51) Int. Cl.
*H03M 1/36* (2006.01)

(52) U.S. Cl. ...................... 341/159; 341/155
(58) Field of Classification Search ......... 341/130–165
See application file for complete search history.

(56) References Cited

U.S. PATENT DOCUMENTS

| | | | |
|---|---|---|---|
| 5,589,831 A | 12/1996 | Knee | |
| 5,815,106 A | 9/1998 | Poss et al. | |
| 6,882,294 B2 * | 4/2005 | Linder et al. | 341/156 |
| 6,963,298 B2 * | 11/2005 | Otsuka et al. | 341/155 |
| 6,989,778 B2 * | 1/2006 | Clara et al. | 341/154 |
| 7,102,424 B2 * | 9/2006 | Vorenkamp | 341/154 |

OTHER PUBLICATIONS

"A 2.5-V BiCMOS Comparator with Current-Mode Interpolation"—Andrea Boni, Carol Morandi, and Silvia Padoan—IEEE Journal of Solid-State Circuits, Vo. 34, No. 6, Jun. 1999—pp. 892-897.

"A 65-mW, 10bit, 40-Msample/s BiCMOS Nyquist ADC in 0.8 mm2"—Gian Hoogzaad, Member, IEEE, and Raf Roovers, Member, IEEE—IEEE Journal of Solid-State circuits, vol. 34, No. 12, Dec. 1999—pp. 1796-1802.

"Designtechniques For A Fully Differential Low Voltage Low-Power Flash Analog To Digital Converter"—Tsung-Sum Lee, Li-Dyi Luo, and Chin-Sheng Lin, Department of Electronic Engineering, National Yunlin University of Science and Technology; Touliu, Yunlin, Taiwan R.O.C.—pp. I-821 thru I-824, no date.

"Design Techniques for A CMOS Low-Power Low-Voltage Fully Differential Flash Analog-To-Digital Converter"; Tsung-Sum Lee, Li-Dyi Luo, and Chin-Sheng Lin, Department of Electronic Engineering, National Yunlin University of Science and Technology; Touliu, Yunlin 640, Taiwan, R.O.C.—pp. I-357 thru I-360, no date.

(Continued)

*Primary Examiner*—Rexford Barnie
*Assistant Examiner*—Lam T. Mai

(57) ABSTRACT

A differential analog to digital converter (ADC) comprises first and second resistance ladder legs, first and second amplifiers, and a plurality of comparators. Each resistance ladder leg includes two resistances having first ends that communicate with a middle node and second ends that communicate with a current source. The first amplifier applies a voltage based upon a first phase of an input signal to the middle node of the first resistance ladder leg. The second amplifier applies a voltage based upon a second phase of the input signal to the middle node of the second resistance ladder leg. The plurality of comparators each has first and second inputs, wherein the first input communicates with one of the two resistances of the first resistance ladder leg, and the second input communicates with one of the two resistances of the second resistance ladder leg.

36 Claims, 12 Drawing Sheets

OTHER PUBLICATIONS

"Application of the Operational Transconductance Amplifier (OTA) to Voltage-controlled Amplifiers and Active Filters"—by w.grise@morehead-st.edu; Deparment of IET, Morehead State University, Morehead, KY 40351; pp. 1-8, no date.

"Differential High-Speed Analog to Digital Converter"; Goetschel, CJ Greene, RA Kertis, RA Philpott, RA Richetta, RA Schmerbeck, TJ Schulte, DJ Swart, DP; Location—Rochester; Jan. 1995 . . . IBM Technical Disclosure Bullentin . . . pp. 425-428.

Dallas Semiconductor Maxim—A/D and D/A Conversions/Sampling Circuits; Understanding Flash ADC's; Application Note 810: Oct. 2, 2001. pp. 1-7.

"electronic design"; The Authority on Emerging Technologies for Design Solutions; What's All This Transimpedance Amplifier Stuff, Anyhow? (Part 1); Bob Pease; ED Online ID #4346; Jan. 8, 2001; pp. 1-10.

* cited by examiner

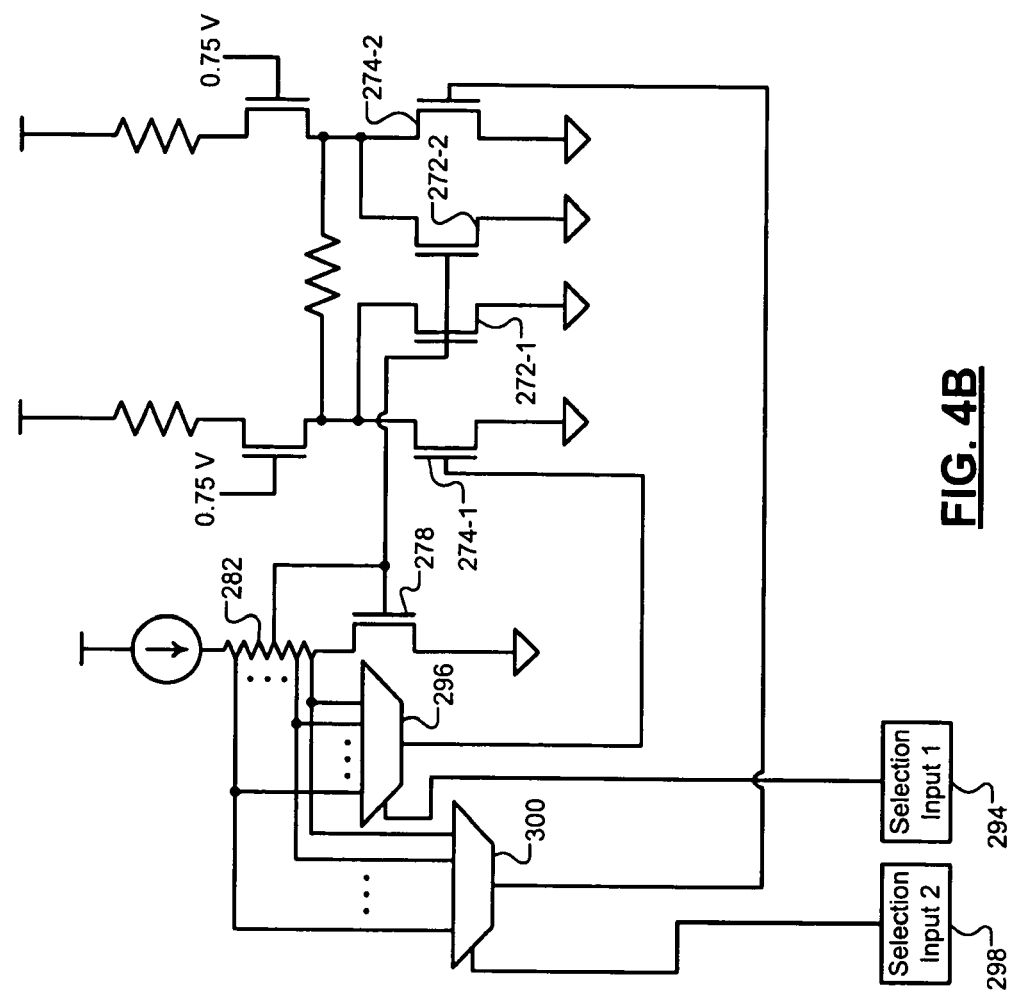
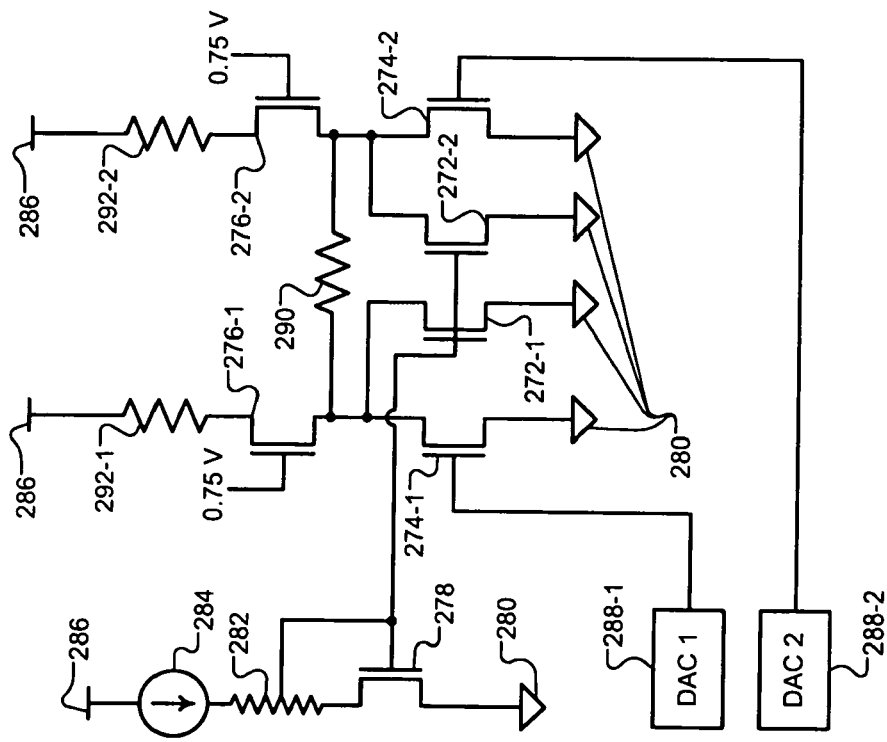
FIG. 4B
FIG. 4A

FLASH ADC

CROSS-REFERENCE TO RELATED APPLICATIONS

This application claims the benefit of U.S. Provisional Application No. 60/759,869, filed on Jan. 18, 2006 and U.S. Provisional Application No. 60/773,029, filed on Feb. 14, 2006, which is incorporated herein by reference in its entirety.

FIELD OF THE INVENTION

The present invention relates to analog to digital converters, and more particularly to flash analog to digital converters.

BACKGROUND OF THE INVENTION

Referring now to FIG. 1, a functional circuit diagram of a differential resistance ladder for an analog to digital converter (ADC) is presented. The differential resistance ladder includes a positive leg 100 and a negative leg 101, which respectively receive a positive phase and a negative phase of an input signal. The positive leg 100 includes a first voltage source 102 that outputs an AC voltage equal to the positive phase ($V_+$) of the input signal, referenced to a ground potential 104. This voltage is applied to a first terminal of a first resistance 106 including resistances 106-1, 106-2, . . . , and 106-N. An opposite terminal of the first resistance 106 communicates with a first terminal of a second resistance 108 including resistances 108-1, 108-2, . . . , and 108-N. An opposite terminal of the second resistance 108 communicates with a second voltage source 110. The second voltage source 110 outputs a voltage equal to $V_+$ minus a DC voltage ($V_{DC}$), referenced to ground 104.

The negative leg 101 includes a third voltage source 112 that outputs an AC voltage equal to the negative phase ($V_-$) of the input signal to a first terminal of a third resistance 114 including resistances 114-1, 114-2, . . . , and 114-N. An opposite terminal of the third resistance 114 communicates with a first terminal of a fourth resistance 116 including resistances 116-1, 116-2, . . . , and 116-N. An opposite terminal of the fourth resistance 116 communicates with a fourth voltage source 118. The fourth voltage source 118 outputs a voltage equal to $V_-$ minus the DC voltage ($V_{DC}$), referenced to ground. The first and second resistances 106 and 108 are generally comprised of a number (often a power of two) of smaller resistances. Also, the third and fourth resistances 114 and 116 are often comprised of a number of smaller resistances. For a linear ADC, the number of smaller resistances that define each of the resistances 106, 108, 114, and 116 will generally be equal.

Referring now to FIG. 2, a functional circuit diagram of an alternative differential resistance ladder configuration according to the prior art is presented. The differential resistance ladder includes a positive leg 136 and a negative leg 138, which respectively receive a positive phase and a negative phase of an input signal. The positive leg 136 includes a first voltage source 140 that outputs a voltage equal to the positive phase ($V_+$) of the input signal, referenced to ground. This voltage is applied to a first terminal of a first resistance 142 including resistances 142-1, 142-2, . . . , and 142-N. An opposite terminal of the first resistance 142 communicates with a first terminal of a second resistance 144 including resistances 144-1, 144-2, . . . , and 144-N and with a second voltage source 146. The second voltage source 146 outputs a voltage equal to $V_+$ minus half of a DC voltage ($V_{DC}$), referenced to ground. An opposite terminal of the second resistance 144 communicates with a third voltage source 148, which outputs a voltage equal to $V_+$ minus $V_{DC}$, referenced to ground.

The negative leg 138 includes a fourth voltage source 150 that outputs a voltage equal to the negative phase ($V_-$) of the input signal, referenced to ground. The fourth voltage source 150 communicates with a first terminal of a first resistance 152 including resistances 152-1, 152-2, . . . , and 152-N. An opposite terminal of the third resistance 152 communicates with a first terminal of a fourth resistance 154 including resistances 154-1, 154-2, . . . , and 154-N and with a fifth voltage source 156. The fifth voltage source 156 outputs a voltage equal to $V_-$ minus $V_{DC}/2$, referenced to ground. An opposite terminal of the fourth resistance 154 communicates with a sixth voltage source 158, which outputs a voltage equal to $V_-$ minus $V_{DC}$, referenced to ground.

The resistances 142, 144, 152, and 154 are each often composed of a number of smaller resistances (generally an equal number for a linear ADC). The configuration of FIG. 2 is similar to that of FIG. 1, with the addition of the second and fifth voltage sources 146 and 156. The second voltage source 146 is connected to the center node, the node between the first and second resistances 142 and 144. Without the second voltage source 146, the center node would receive the input signal last, being equidistant from the driving voltage sources 140 and 148. The addition of the second voltage source 146 removes delay from this node. The greatest delay is now in the midpoint of the first resistance 142 and the midpoint of the second resistance 144. These midpoints experience only one quarter of the RC delay that the center node had previously, being half as far from the driving voltage sources 140 and 146. The same modification is made to the negative leg 138, adding the fifth voltage source 156 to the node that would otherwise experience the greatest delay.

SUMMARY OF THE INVENTION

A differential analog to digital converter (ADC) comprises first and second resistance ladder legs, first and second amplifiers, and a plurality of comparators. The first resistance ladder leg includes two resistances having first ends that communicate with a middle node and second ends that communicate with a current source. The second resistance ladder leg includes two resistances having first ends that communicate with a middle node and second ends that communicate with a current source. The first amplifier applies a voltage based upon a first phase of an input signal to the middle node of the first resistance ladder leg. The second amplifier applies a voltage based upon a second phase of the input signal to the middle node of the second resistance ladder leg. The plurality of comparators each has first and second inputs, wherein the first input communicates with one of the two resistances of the first resistance ladder leg, and the second input communicates with one of the two resistances of the second resistance ladder leg.

In other features, each of the plurality of comparators are calibrated. The current sources of the first and second resistance ladder legs are turned off during calibration. The first and second amplifiers output voltages based upon an input signal that is substantially equal to zero during calibration. Each of the plurality of comparators includes an adjustable current source that is adjusted based upon a respective digital value. The respective digital values are determined during calibration.

In still other features, the ADC further comprises a control module that, during calibration, varies the respective digital values based upon outputs of the plurality of comparators. The first and second amplifiers include transimpedance amplifiers. The first and second amplifiers include nested transimpedance amplifiers. Each of the resistances of the first and second resistance ladder legs comprises N individual resistances, wherein N is an integer greater than one. The individual resistances have substantially equal resistance values.

In further features, the resistances of the first resistance ladder legs comprise N individual resistances connected in series. The resistances of the first resistance ladder leg comprise a plurality of primary resistances connected in series and groups of secondary resistances connected in parallel with each of the primary resistances. The resistances of the first resistance ladder leg comprise a plurality of primary resistances connected in series, groups of secondary resistances connected in parallel with each of the primary resistances, and groups of tertiary resistances connected in parallel with each of the secondary resistances.

In other features, the resistances of the first resistance ladder leg comprise N individual resistances. The first inputs of the comparators communicate with a connection between two of the N individual resistances of the first resistance ladder leg, and the second inputs communicate with a connection between two of the individual resistances of the second resistance ladder leg. The first and second inputs of the plurality of comparators experience a propagation delay based upon an electrical distance of the first and second inputs from a corresponding one of the middle nodes.

In still other features, the ADC further comprises delay elements that communicate with the first and second inputs of the comparators and that create substantially identical aggregate delays from corresponding ones of the middle nodes to the first and second inputs of the comparators. The delay elements comprise resistive traces and/or transistors. The ADC further comprises a plurality of latching devices each corresponding to one of the plurality of comparators. The plurality of latching devices latch an output from a corresponding one of the plurality of comparators at a delayed time based upon a propagation delay at at least one of first and second inputs of the corresponding one of the plurality of comparators.

In further features, the ADC further comprises a decoding module that reads outputs of the plurality of latching devices substantially simultaneously after a last one of the plurality of latching devices is actuated. The ADC is implemented on an integrated circuit having a first metal layer, and wherein the first and second resistance ladder legs are implemented in the first metal layer. The two resistances of the first resistance ladder leg are connected at the middle node, and are laid out as mirror images of each other, and wherein the two resistances of the second resistance ladder leg are connected at the middle node, and are laid out as mirror images of each other. Each of the resistances of both the first and second resistance ladder legs is laid out in a folded shape to minimize area.

A method for converting from analog to digital comprises providing a first resistance ladder leg including two resistances having first ends that communicate with a middle node and second ends that communicate with a current source; providing a second resistance ladder leg including two resistances having first ends that communicate with a middle node and second ends that communicate with a current source; applying a voltage based upon a first phase of an input signal to the middle node of the first resistance ladder leg; applying a voltage based upon a second phase of the input signal to the middle node of the second resistance ladder leg; and providing a plurality of comparators, each having first and second inputs, wherein the first input communicates with one of the two resistances of the first resistance ladder leg, and the second input communicates with one of the two resistances of the second resistance ladder leg.

In other features, the method further comprises calibrating the plurality of comparators. The method further comprises turning off the current sources of the first and second resistance ladder legs during calibration. The method further comprises setting the input signal substantially equal to zero during calibration. The method further comprises adjusting a current source for each of the plurality of comparators based upon a respective digital value. The method further comprises determining the respective digital values during calibration.

In still other features, the method further comprises varying the respective digital values based upon outputs of the plurality of comparators. The method further comprises creating delays from corresponding ones of the middle nodes to the first and second inputs of the comparators that are substantially identical for each of the comparators. The method further comprises latching an output from a corresponding one of the plurality of comparators at a delayed time based upon a propagation delay at at least one of first and second inputs of the corresponding one of the plurality of comparators. The method further comprises reading latched outputs substantially simultaneously after a last latching event.

A differential analog to digital converter (ADC) comprises first ladder means for providing two resistances having first ends that communicate with a middle node and second ends that communicate with current sourcing means for providing current; second ladder means for providing two resistances having first ends that communicate with a middle node and second ends that communicate with current sourcing means for providing current; first amplifying means for applying a voltage based upon a first phase of an input signal to the middle node of the first ladder means; second amplifying means for applying a voltage based upon a second phase of the input signal to the middle node of the second ladder means; and a plurality of comparing means for comparing voltages at first and second inputs, wherein the first input communicates with one of the two resistances of the first ladder means, and the second input communicates with one of the two resistances of the second ladder means.

In other features, each of the plurality of comparing means are calibrated. The current means of the first and second ladder means are turned off during calibration. The first and second amplifying means output voltages based upon an input signal that is substantially equal to zero during calibration. Each of the plurality of comparing means includes an adjustable current means that is adjusted based upon a respective digital value. The respective digital values are determined during calibration.

In still other features, the ADC further comprises control means for varying the respective digital values based upon outputs of the plurality of comparing means during calibration. The first and second amplifying means include transimpedance amplifying means. The first and second amplifying means include nested transimpedance amplifying means. Each of the resistances of the first and second ladder means comprises N individual resistances, wherein N is an integer greater than one. The individual resistances have substantially equal resistance values.

In further features, the resistances of the first ladder means comprise N individual resistances connected in series. The resistances of the first ladder means comprise a plurality of primary resistances connected in series and groups of secondary resistances connected in parallel with each of the primary resistances. The resistances of the first ladder means comprise a plurality of primary resistances connected in series, groups of secondary resistances connected in parallel with each of the primary resistances, and groups of tertiary resistances connected in parallel with each of the secondary resistances.

In other features, the resistances of the first ladder means comprise N individual resistances. The first inputs of the comparing means communicate with a connection between two of the N individual resistances of the first ladder means, and the second inputs communicate with a connection between two of the individual resistances of the second ladder means. The first and second inputs of the plurality of comparing means experience a propagation delay based upon an electrical distance of the first and second inputs from a corresponding one of the middle nodes.

In still other features, the ADC further comprises delaying means for creating substantially identical aggregate delays from corresponding ones of the middle nodes to the first and second inputs of the comparing means. The delaying means comprise resistive traces. The delaying means comprise transistors. The ADC further comprises latching means for latching outputs of the plurality of comparing means. The latching means latch an output from a corresponding one of the plurality of comparing means at a delayed time based upon a propagation delay at at least one of first and second inputs of the corresponding one of the plurality of comparing means.

In further features, the ADC further comprises decoding means for reading outputs of the plurality of latching devices substantially simultaneously after a last one of the plurality of latching devices is actuated. The ADC is implemented on an integrated circuit having a first metal layer, and wherein the first and second ladder means are implemented in the first metal layer. The two resistances of the first ladder means are connected at the middle node, and are laid out as mirror images of each other, and wherein the two resistances of the second ladder means are connected at the middle node, and are laid out as mirror images of each other. Each of the resistances of both the first and second ladder means is laid out in a folded shape to minimize area.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 4A is a functional circuit diagram of an exemplary implementation of the first (preamp) stage of a comparator;

FIG. 4B is a more detailed functional circuit diagram of an exemplary implementation of the first (preamp) stage of a comparator;

DETAILED DESCRIPTION OF THE PREFERRED EMBODIMENTS

Figure 2:
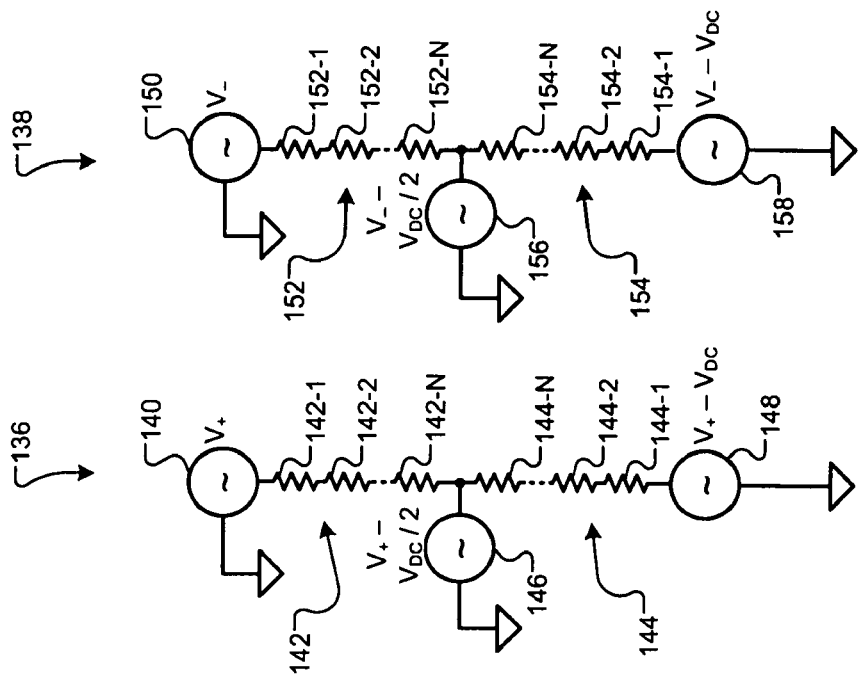
FIG. 2 is a functional circuit diagram of an alternative differential resistance ladder configuration according to the prior art.
Figure 1:
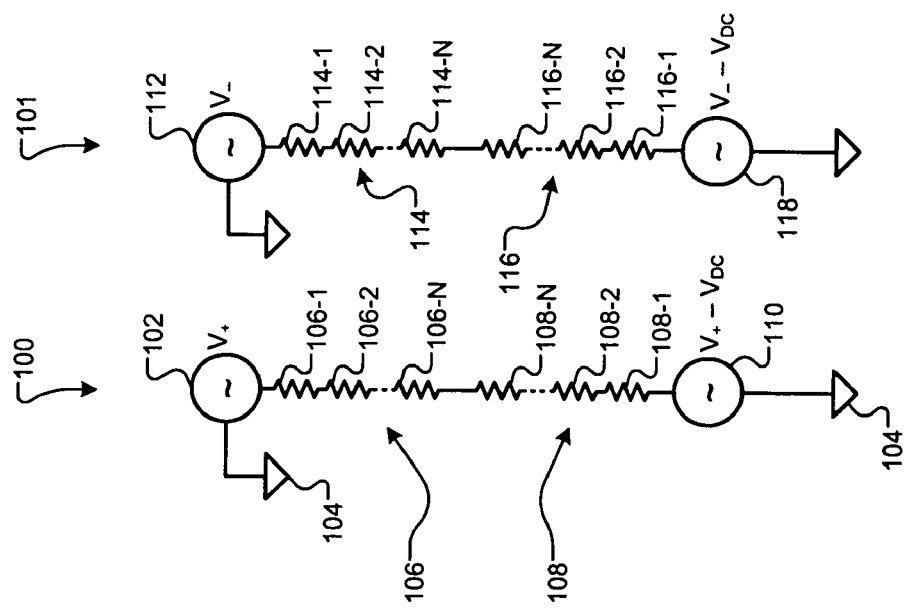
FIG. 1 is a functional circuit diagram of a differential resistance ladder according to the prior art for an analog to digital converter (ADC)

The following description of the preferred embodiments is merely exemplary in nature and is in no way intended to limit the invention, its application, or uses. For purposes of clarity, the same reference numbers will be used in the drawings to identify similar elements. As used herein, the term module refers to an application specific integrated circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present invention.

Figure 3:
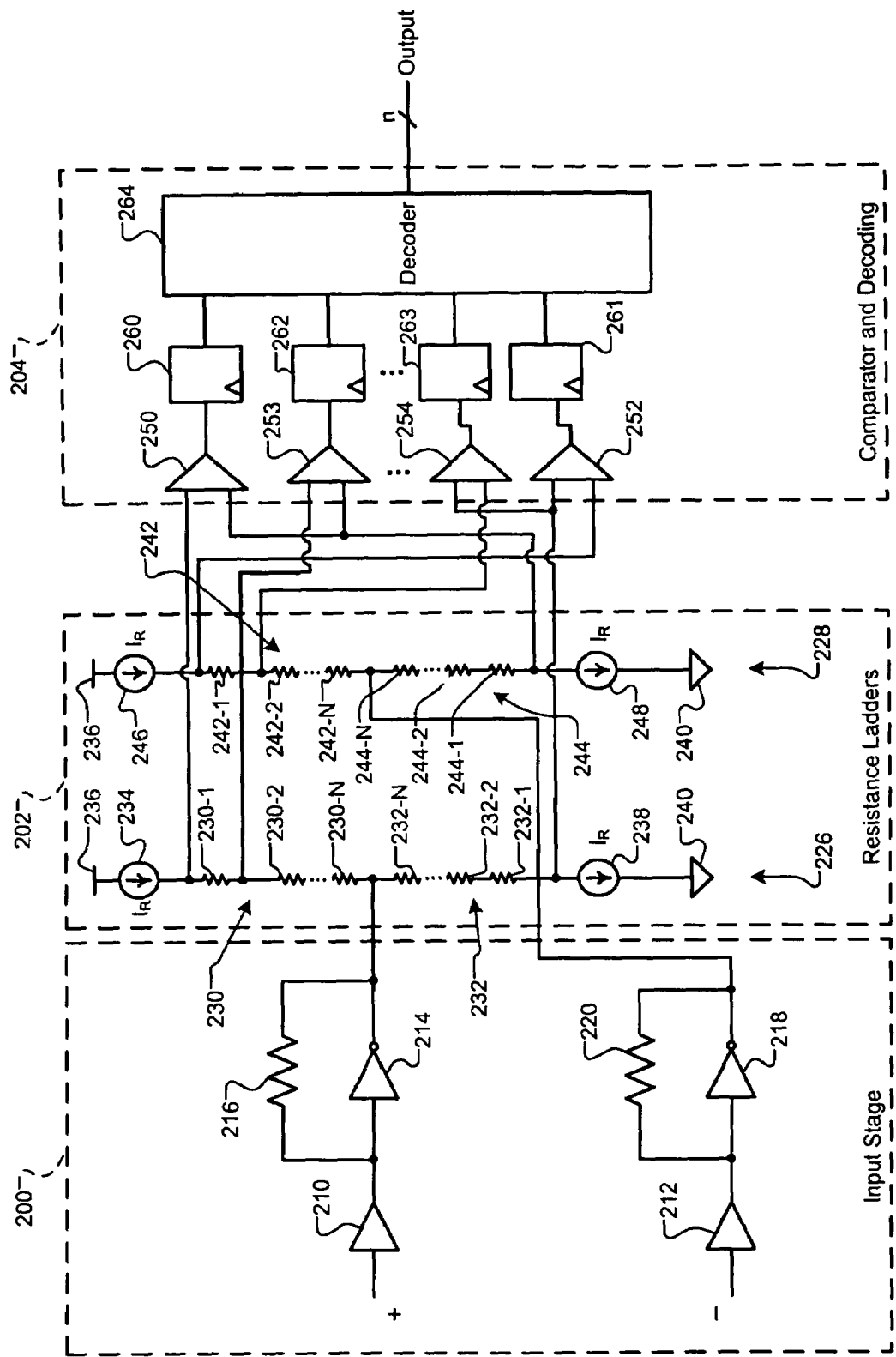
FIG. 3 is a functional circuit diagram of a differential ADC.
Figure 5:
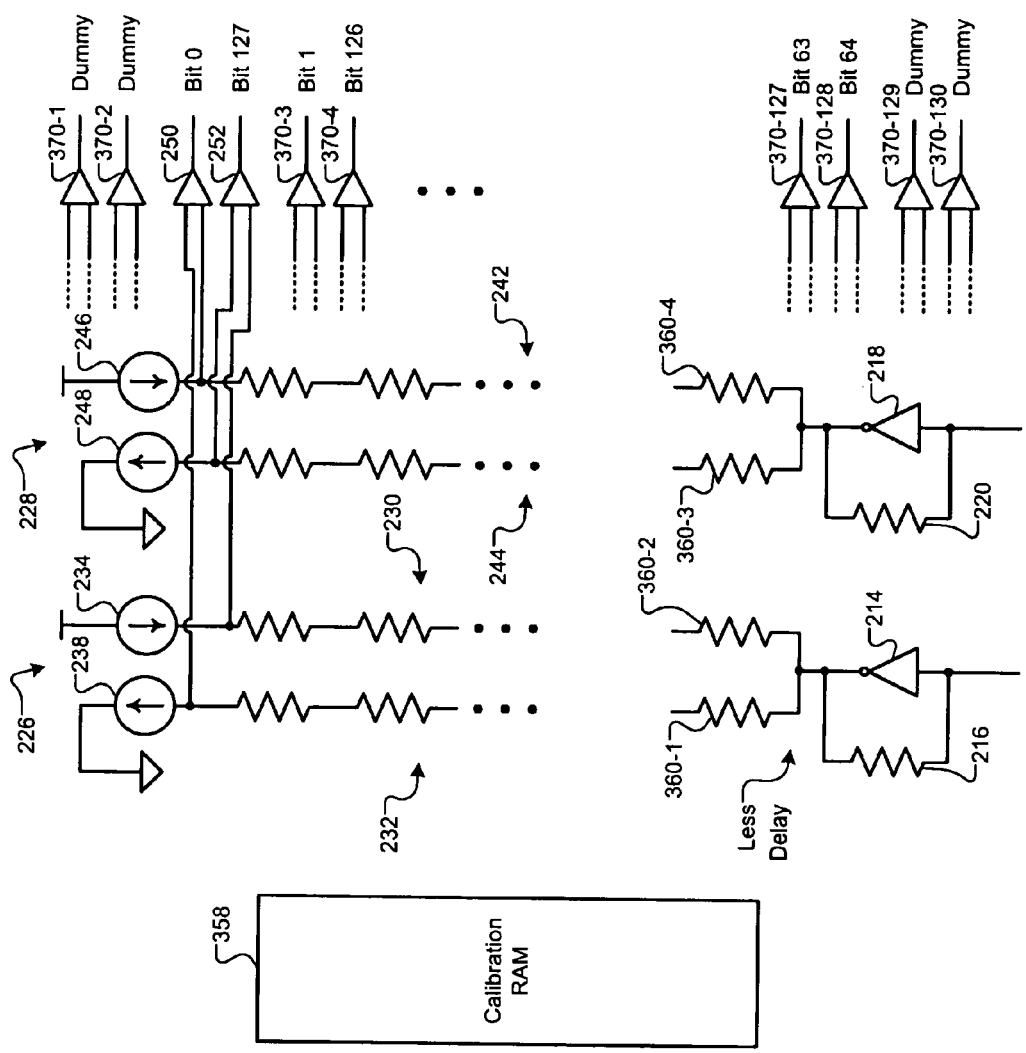
FIG. 5 is an exemplary high-level physical layout of the ADC of FIG. 3.

Referring now to FIGS. 3 and 5, a functional circuit diagram of a differential analog to digital converter (ADC) is presented. The ADC includes three stages: an input stage 200, a resistance ladder and bias stage 202, and a comparator and decoding stage 204. In addition, the ADC may include further digital logic after or during the decoding stage 204, such as a Half-Gray encoder for reducing spurious output codes. The ADC may also include further conditioning circuitry and/or sample-and-hold circuitry prior to, or as part of, the input stage 200.

The input stage 200 receives a differential signal having a positive phase and a negative phase. The positive phase is communicated to an input of a first amplifier 210 and the negative phase is communicated to an input of a second amplifier 212. An output of the first amplifier 210 communicates with an input of a third amplifier 214 and with a first terminal of a first feedback resistance 216. An opposite terminal of the first feedback resistance 216 communicates with an output of the third amplifier 214, creating a transimpedance amplifier (i.e., an amplifier that converts an input current to an output voltage). The first and third amplifiers 210 and 214 and first feedback resistance 216 may be replaced by any suitable amplifier configuration, including a nested transimpedance amplifier. This and other suitable nested transimpedance amplifiers are described more fully in, for example, U.S. patent application Ser. No. 10/459,731, filed Jun. 11, 2003, which is hereby incorporated by reference in its entirety.

An output of the second amplifier 212 communicates with an input of a fourth amplifier 218 and with a first terminal of a second feedback resistance 220. An opposite terminal of the second feedback resistance 220 communicates with an output of the fourth amplifier 218. The second and fourth amplifiers 212 and 218 and second feedback resistance 220 can also be replaced by any suitable amplifier configuration, including a nested transimpedance amplifier.

The resistance ladder stage 202 includes a positive leg 226 and a negative leg 228. The output of the third amplifier 214 communicates with an input node of the positive leg 226. The output of the fourth amplifier 218 communicates with an input node of the negative leg 228. The input node of the positive leg 226 communicates with first terminals of a first ladder resistance 230 including resistances 230-1, 230-2, . . . , and 230-N and a second ladder resistance 232 including resistances 232-1, 232-2, . . . , and 232-N. An opposite terminal of the first ladder resistance 230 communicates with a first current source 234, which draws current from a supply potential 236. An opposite terminal of the second ladder resistance 232 communicates with a second current source 238, which sinks current to a ground potential 240.

The input node of the negative leg 228 communicates with first terminals of a third ladder resistance 242 including resistances 242-1, 242-2, . . . , and 242-N and a fourth ladder resistance 244 including resistances 244-1, 244-2, . . . , and 244-N. An opposite terminal of the third ladder resistance 242 communicates with a third current source 246, which draws current from the supply potential 236. An opposite terminal of the fourth ladder resistance 244 communicates with a fourth current source 248, which sinks current to the ground potential 240.

The four current sources 234, 238, 246, and 248 each supply a bias current of $I_R$ which creates a constant voltage across each ladder resistance 230, 232, 242, and 244 equal to the value of the ladder resistance (R) times $I_R$. The output of the third amplifier 214 varies the voltage at the input node of the positive leg 226. Because the current flowing through the first and second ladder resistances 230 and 232 is held constant, the voltages at the opposite terminals of the ladder resistances 230 and 232 will remain a constant voltage apart from the input node.

The voltage swing at the input node of the positive leg 226 is therefore limited by the voltage limits of the current sources 234 and 238. Assuming, for example, that the supply potential 236 is a regulated 1.5 V (which may be derived from a 1.8 V supply) and the value of each ladder resistance (R) is 50Ω, an appropriate current $I_R$ would be 5 mA. This creates a voltage across each ladder resistance of 0.25 V. If the current sources 234 and 238 require at least a 0.25 V voltage drop, the voltage of the input node can reach within 0.5 V of the supply potential 236 and within 0.5 V of the ground potential 240. This is a voltage swing from 0.5 V to 1.0 V, or 0.5 V peak-to-peak.

When a similar analysis is applied to the negative leg 228, the input node of the negative leg 228 can also achieve a 0.5 $V_{ppk}$ swing. When the negative leg 228 and positive leg 226 are driven in opposite directions, a differential $V_{ppk}$ swing of 1.0 V is possible. As the current sources 234, 238, 246, and 248 operate close to their minimal voltage of 0.25 V, their current may vary from ideal. To absorb this variation of current, the third and fourth amplifiers 214 and 218 may be designed as super transconductance or $g_m$ amplifiers.

The comparator and decoding stage 204 includes comparators 250, 252, 253, and 254. A terminal of the first ladder resistance 230-1 communicates with a first input of the comparator 250. A terminal of the fourth ladder resistance 244-1 communicates with a second input of the comparator 250. A terminal of the second ladder resistance 232-1 communicates with a first input of the comparator 252. A terminal of the third ladder resistance 242-1 communicates with a second input of the comparator 252. A terminal between resistances 230-1 and 230-2 communicates with a first input of the comparator 253. A terminal of the fourth ladder resistance 244-1 communicates with a second input of the comparator 253. A terminal of the second ladder resistance 232-1 communicates with a first input of the comparator 254. A terminal between resistances 242-1 and 242-2 communicates with a second input of the comparator 254.

The number of resistances N comprising each of the ladder resistances 230, 232, 246, and 248 are generally equal for a linear ADC. The " . . . " between comparators 253 and 254 is shown for illustrative purposes as representative of additional comparators an actual ADC may contain. Communication of comparators with internal nodes of the ladder resistances 230, 232, 242, and 244 will be described in more detail below with respect to FIG. 5.

An output of the comparator 250 communicates with an input of a latching device 260. An output of the comparator 252 communicates with an input of a latching device 261. An output of the comparator 253 communicates with an input of a latching device 262. An output of the comparator 254 communicates with an input of a latching device 263. Outputs of the latching devices 260–263 communicate with inputs of a decoder module 264. The decoder module 264 contains logic (often combinational) that converts a signal at its input into an n-bit output signal. The signal at the input of the decoder module 264 is generally a thermometer code—i.e., all bits more significant than a certain bit are 0, while the rest are 1 (or vice versa).

As a numerical example of the performance characteristics of this ADC implementation, assume that each comparator has an input capacitance ($C_{in}$ of 0.4 pF). Each ladder resistance (230, 232, 242, and 244) sees one-half of that input capacitance (0.2 pF), but because the loading of the comparators is distributed, the actual capacitance seen by each ladder resistance is only slightly higher than 0.1 pF. The worst-case delay from the input node to the end of one of the ladder resistances can be estimated from the RC time constant. With a resistance of 50Ω, the delay is approximately 50Ω×0.1 pF=5 ps. If the necessary bandwidth is, for example, 100 MHz (which is adequate for Gigabit Ethernet or 2.5 Gb Ethernet), the period of a 100 MHz signal is 10 ns, yielding 5 ps/10 ns, or $0.5\times10^{-3}$ signal period. This is approximately a 10-bit signal resolution, greater than the 7 or 8 bits required for 2.5 Gb Ethernet.

When calibrating offsets of the comparators, the current sources 234, 238, 246, and 248 can be shut down. This ensures that, as long as there is no input signal, all comparators will see zero input voltage difference. For calibration then, the input signal can be removed, or the second and fourth amplifiers 214 and 218 can operate as if the input signal were zero. Additionally, each of the comparators can be calibrated at the sweet spot of operating common mode input voltage (the middle voltage). This is beneficial because the comparators producing the transition in the thermometer code are operating near the middle voltage.

Referring now to FIG. 4A, a functional circuit diagram of an exemplary implementation of the first (preamp) stage of a comparator is depicted. This circuit includes first, second, third, fourth, fifth, sixth, and seventh transistors 272-1, 272-2, 274-1, 274-2, 276-1, 276-2, and 278. In this implementation, the first, second, third, fourth, fifth, sixth, and seventh transistors 272, 274, 276, and 278 are metal oxide semi-conductor field-effect transistors (MOSFETs) that have gates, sources, and drains, although other transistor types may be used.

The sources (or second terminals) of the first, second, third, and fourth transistors 272 and 274 communicate with a ground potential 280. The gate terminals (or control terminals) of the first and second transistors 272 communicate with a current mirror, which sets the bias current for the first and second transistors 272. The current mirror includes the seventh transistor 278, a first resistance 282, and a current source 284. The current source 284 communicates with a supply potential 286 and outputs a current to a first terminal of the first resistance 282. An opposite terminal of the first resistance 282 communicates with the drain (or first terminal) of the seventh transistor 278. A tap of the first resistance 282 communicates with the gate of the seventh transistor 278. In some implementations, the tap of the first resistance 282 is the center tap. The source of the seventh transistor 278 communicates with the ground potential 280.

The gate of the seventh transistor 278 communicates with the gates of the first and second transistors 272. The gates of the third and fourth transistors 274 are controlled by first and second digital to analog converters (DACs) 288-1 and 288-2, respectively. The drains of the first and third transistors 272-1 and 274-1 communicate with each other and with the drain of the fifth transistor 276-1 and a first terminal of a second resistance 290. The drains of the second and fourth transistors 272-2 and 274-2 communicate with each other and with the drain of the sixth transistor 276-2 and an opposite terminal of the second resistance 290.

In this circuit configuration, the current through the first and third transistors 272-1 and 274-1 sums to create the bias current for the fifth transistor 276-1. Likewise, the current through the second and fourth transistors 272-2 and 274-2 sums to create the bias current for the sixth transistor 276-2. The first and second DACs 288-1 and 288-2 each receive a digital input that, when converted to analog, will establish the proper compensation current through the third and fourth transistors 274. The values of the digital inputs to the respective DACs 288-1 are calibrated such that the currents remove any offset voltage from the comparator. During calibration, the gates of the fifth and sixth transistors 276, which are the inputs to the comparator, may be held at a reference voltage such as 0.75 V.

The source of the fifth transistor 276-1 communicates with a first terminal of a third resistance 292-1. An opposite terminal of the third resistance 292-1 communicates with the supply potential 286. The source of the sixth transistor 276-2 communicates with a first terminal of a fourth resistance 292-2. An opposite terminal of the fourth resistance 292-2 communicates with the supply potential 286.

Referring now to FIG. 4B, a more detailed functional circuit diagram of an exemplary implementation of the first (preamp) stage of a comparator is depicted. This implementation is similar to that of FIG. 4A, with one possible implementation of the DACs 288 shown in greater detail. DAC 1 288-1 of FIG. 4A is composed, in this implementation, of a first selection input 294 and a first analog multiplexer 296. DAC 2 288-2 of FIG. 4A is composed, in this implementation, of a second selection input 298 and a second analog multiplexer 300.

The multiplexers 296 and 300 receive analog voltages from the first resistance 282. Three representative connections are shown, though more or fewer are possible. The multiplexers 296 and 300 are shown using the same connections to the first resistance 282, though different numbers and points of connection are possible. The first selection input 294 instructs the first multiplexer 296 to select one of its analog input voltages. This voltage, which may be amplified by the multiplexer 296, is communicated to the gate of the third transistor 274-1. The second selection input 298 instructs the second multiplexer 296 to select one of its analog input voltages, which is communicated to the gate of the fourth transistor 274-2.

The voltage chosen by the first multiplexer 296 may be from the same tap that communicates with the gate of the seventh transistor 278. In this case, the voltage at the gate of the third transistor 274-1 will be the same as that at the gate of the first transistor 272-1. If the first and third transistors 272-1 and 274-1 are matched, their combined current will then be double. If the third transistor 274-1 is sized to be one-fourth of the first transistor 272-1, combined current will be 125% of the first transistor 272-1 alone. This arrangement will allow finer adjustments in combined current, compared to equally-sized transistors.

Figure 4C:
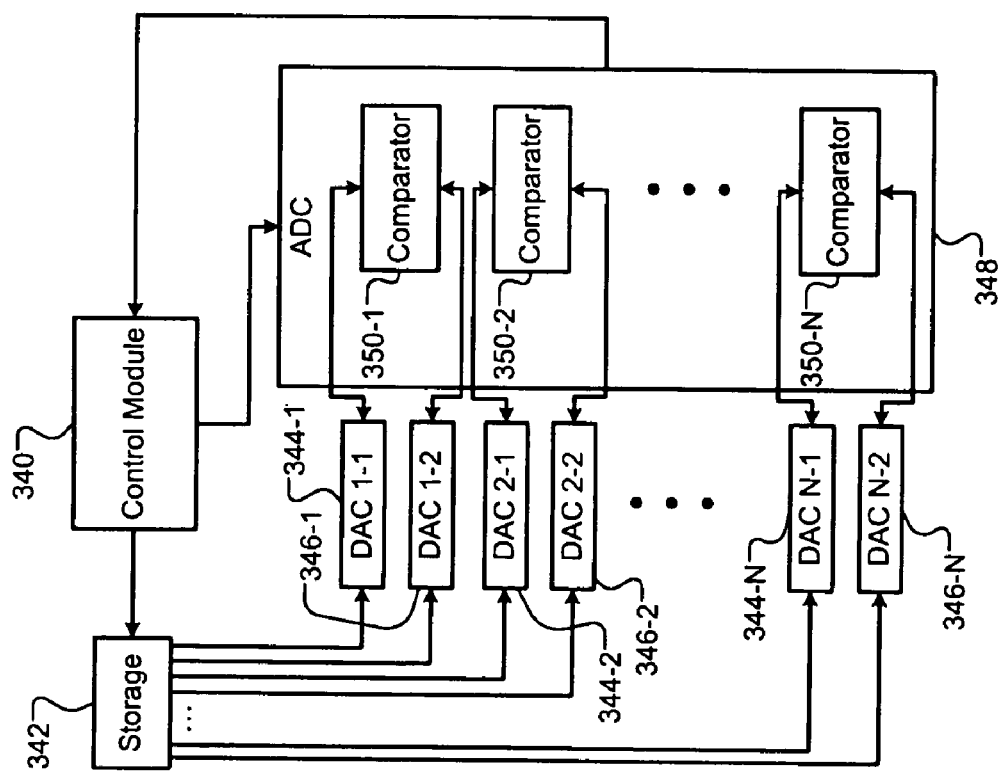
FIG. 4C is a functional block diagram of an exemplary calibration implementation.

Referring now to FIG. 4C, a functional block diagram of an exemplary calibration implementation according to the principles of the present invention is depicted. A control module 340 stores a set of digital values into a storage module 342. The storage module communicates with first and second sets of digital to analog converters (DACs) 344 and 346. The DACs 344 and 346 receive digital values from the storage module 342 and convert these values into analog signals. These analog signals may be voltage and/or current. An analog to digital converter (ADC) 348 according to the principles of the present invention includes a set of N differential comparators 350, including comparators 350-1, 350-2, ..., and 350-N. Each differential comparator 350 has a positive input node, which is biased by one DAC of the first set of DACs 344, and a negative input node, which is biased by one DAC of the second set of DACs 346.

In FIG. 4C, for example, the positive input of the first comparator 350-1 is biased by the analog output of DAC 1-1 344-1, while the negative input is biased by DAC 1-2 346-1. The second comparator 350-2 has a positive input that is biased by DAC 2-1 344-2 and a negative input biased by DAC 2-2 346-2. The Nth comparator 350-N has a positive input that is biased by DAC N–1 344-N and a negative input biased by DAC N–2 346-N. A control module 340 communicates with the ADC 348. When calibration is desired, the control module 340 may direct the ADC 348 into a certain state, such as maintaining a zero input voltage and/or setting zero current through the resistance ladder legs. Calibration may be performed, for example, upon start-up of the ADC, at periodic time intervals, when operating parameters such as temperature change, or at other appropriate times. The control module 340 receives the digital output of the ADC 348 and adjusts parameters in the storage module 342 until the output of the ADC 348 reaches a desires value.

In other implementations, a greater or fewer number of DACs may be employed relative to the number of comparators in the ADC 348. For instance, a single DAC may control the bias current for the positive input side of all comparators while a single DAC may control the bias current for the negative input side of all comparators. In another implementation, a DAC may be employed to provide a known input voltage to the input of the ADC 348. The output of the ADC 348 can be compared to this known voltage by the control module 340. The control module 340 may then adjust values in the storage module 342 until the output of the ADC 348 achieves the desired value.

Referring now to FIG. 5, an exemplary high-level physical layout of the ADC of FIG. 3 is depicted. The positive and negative resistance ladder legs 226 and 228 are laid out in between calibration RAM (random-access memory) 358 and the string of comparators. The current sources 238 and 234 of the positive leg 226 are adjacent to one another and also to the current sources 248 and 246 of the negative leg 228. The ladder resistances 230, 232, 242, and 244 are here depicted as their smaller constituent resistances, such as resistances 360-1, 360-2, 360-3, and 360-4.

The output of the second amplifier 214, in communication with the opposite terminal of the first feedback resistance 216, is shown driving the middle node of the positive leg 226—i.e., the node between the first and second ladder resistances 230 and 232. Similarly, the output of the fourth amplifier 218, in communication with the opposite terminal of the second feedback resistance 220, is shown driving the middle node of the negative leg 228. The middle nodes of the positive and negative legs 226 and 228 are located at the bottom of the physical layout, while the current sources 238, 234, 248, and 246 are located at the top.

The comparators are arranged in a row to the right of the resistance ladder legs 226 and 228. The first two comparators 370-1 and 370-2 are dummy comparators. The next two comparators 250 and 252 were depicted in FIG. 3 and are shown connected to the same nodes in the positive and negative legs 226 and 228. The next two comparators 370-3 and 370-4 communicate with internal nodes of the ladder resistances 230, 232, 242, and 244. At the bottom of the string of comparators are the final four comparators 370–127, 370–128, 370–129, and 370–130. Comparators 370–129 and 370–130 are dummy comparators.

Comparators 250 and 252 correspond to bits 0 and 127 in a thermometer code, respectively. Comparators 370-3 and 370-4 correspond to bits 1 and 126, respectively; and comparators 370–127 and 370–128 correspond to bits 63 and 64, respectively. The number of comparators depicted here are those needed in an exemplary implementation of a seven-bit ADC (N=7). There are $2^N+4$ (132) comparators, with four of those being dummy comparators. Each of the legs 226 and 228 of the resistance ladder includes $2^{N-1}$ (64) resistances. Each of the ladder resistances 230, 232, 242, and 244 therefore includes 32 individual resistances.

The signal from the second amplifier 214 experiences the least delay at the point it is injected into the positive leg 226 of the resistance ladder—the node between resistances 360-1 and 360-2. Likewise, the signal from the fourth amplifier 218 experiences the least delay at the point it is injected into the negative leg 226 of the resistance ladder— the center node between resistances 360-3 and 360-4. As the signals propagate from the amplifiers 214 and 218 to the respective ends of each resistance ladder leg 226 and 228, the greatest delay is experienced adjacent to the current sources 234, 238, 246, and 248. The signals arriving at the comparators situated at the ends of the resistance ladders are the most delayed, causing the extremes of voltage measured by the ADC to be delayed relative to middle voltages measured by comparators closer to the amplifiers 214 and 218.

Figure 6:
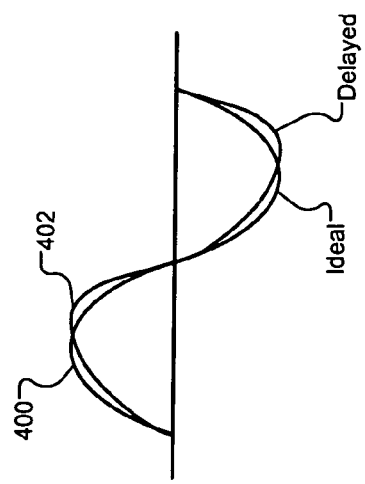
FIG. 6 is a graphical demonstration of the effects of propagation delay distortion.

This distortion is demonstrated graphically in FIG. 6. A period of an ideal sine wave 400 is depicted. Also depicted is a period of a sine wave distorted by the propagation delay inherent in the ADC. Note that at the middle voltage, there is little to no delay, while at the voltage extremes, both plus and minus, there is more delay. Two approaches can mitigate or even eliminate this distortion.

Figure 7:
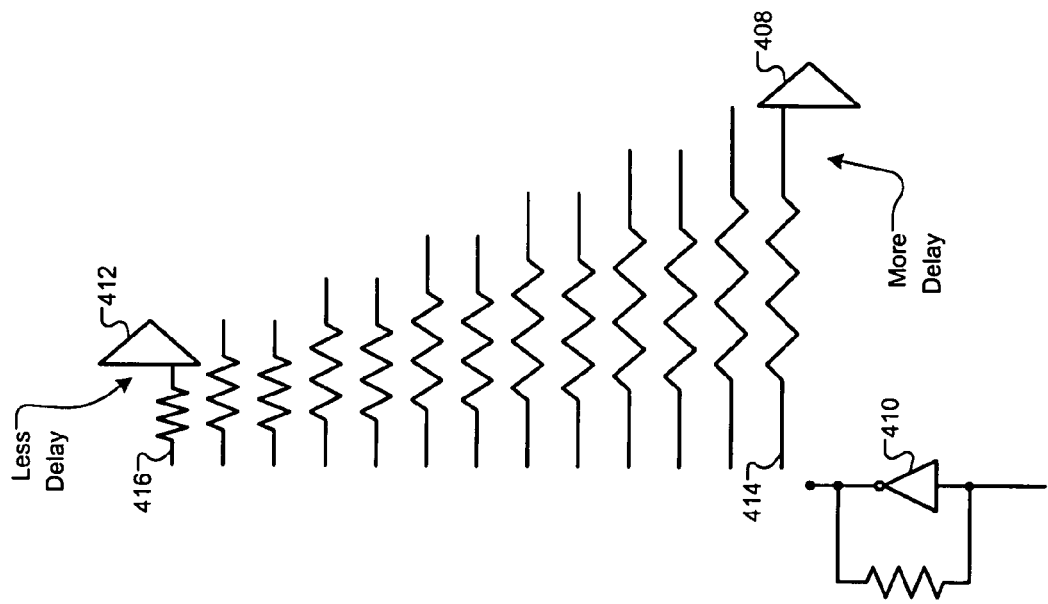
FIG. 7 is a graphical depiction of progressive comparator delay elements.

Referring now to FIG. 7, a graphical depiction of progressive comparator delay elements is presented. The comparator input, represented here at 408, closest to an input amplifier 410 would normally receive the input signal with no delay. Meanwhile, comparator inputs further away from the amplifier 410, such as comparator 412, experience much greater delay. To compensate for this disparity, delay can be artificially added to the input paths leading to the inputs of closer comparator inputs so that all comparator inputs experience the same delay. Comparator inputs closest to the amplifier 410 would require the greatest added delay, represented graphically as a long signal trace 414. Added delay is reduced the further the comparator input is from the amplifier 410, until the furthest comparator input 412 has no added delay, represented by a short signal trace 416.

The comparator input delay may be more feasibly implemented using transistors. Note that because the comparators of interest are those in the transition region (near the middle of the signal), the delay will always be correct if identical transistor elements are used for the delay elements, even though the common mode input voltages of the comparators are normally different. The size of adjustable delay elements should be designed to allow for the value of the largest delay needed.

Figure 8:
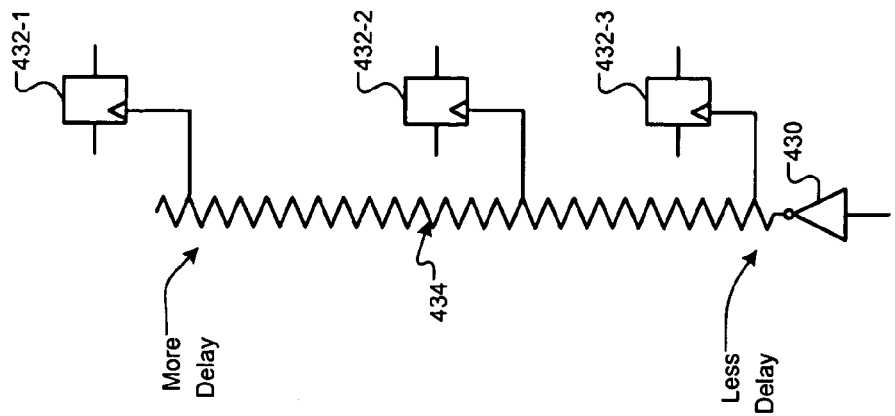
FIG. 8 is an alternative scheme for minimizing distortion due to propagation delay.

Referring now to FIG. 8, an alternative scheme for minimizing distortion due to propagation delay in the ADC is graphically depicted. A strobe amplifier 430 communicates with latching devices (first shown in FIG. 3), three of which are depicted here: first latching device 432-1, second latching device 432-2, and third latching device 432-3. The latching devices 432 receive their input from respective comparators.

Latching devices are activated with a strobe, at which point the latching device retains the value at its input (either a 0 or a 1 received from the respective comparator). Because comparators furthest away from the driving amplifier suffer the most delay, the respective latching devices can be actuated at a correspondingly later time, as determined by the delay the respective comparator experiences. After all latching devices have been strobed, their contents can be read simultaneously to determine the digital output string. This string may be converted from a thermometer code to a binary code by a decoder module (such as the decoder module 264 of FIG. 3). Because the latching devices are all read simultaneously after their contents have been latched, the fact that they were strobed at different times does not translate to the output.

To strobe the latching devices at varying times, a strobe amplifier 430 communicates a strobe signal to the latching devices 432 via a series of delay elements 434. The delay elements 434 are represented graphically as a resistive trace, though other delay elements, such as transistors, may be used. The third latching device 432-3 is closest to the strobe amplifier 430 and will, therefore, latch the output of its respective comparator earliest. The second latching device 432-2 is located further away from the strobe amplifier 430 and therefore latches the output of its respective comparator slightly later. The first latching device 432-1 is located furthest from the strobe amplifier 430 and, therefore, latches its respective input last. To reiterate, the greater delay of the strobe signal in reaching the furthest latching device 432-1 allows time for the input voltage signal to reach the furthest comparator, which is associated with the first latching device 432-1.

Figure 9:
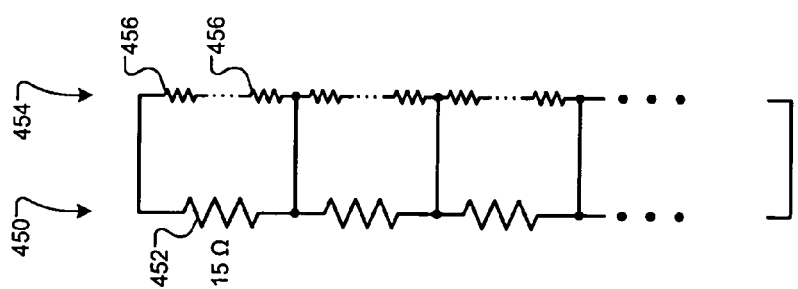
FIG. 9 is a functional circuit diagram of a segmented resistance ladder implementation.

Referring now to FIG. 9, a functional circuit diagram of a segmented resistance ladder implementation is depicted. In previous figures, such as FIG. 5, resistance ladders were depicted as series connections of resistances. For a 100Ω resistance ladder with 128 resistances (which could yield 8 bit resolution in a differential configuration or 7 bit resolution in a single-ended configuration), each resistance would be approximately 0.78Ω (100Ω/128). Resistances this small may be difficult to make accurately, or even to make at all, in many processes. A solution is to use a segmented ladder network.

A main segment 450 includes a number of main segment resistances 452, while a secondary segment 454 includes a number of secondary resistances 456. A group of M secondary resistances 456 are connected in series to each other and then in parallel with a single primary resistance 452. This parallel combination is repeated as many times as is necessary for the resistance ladder. As one example, if there are 8 primary resistances in the main segment, to make a resistance ladder with 128 total steps, each group of secondary resistances should contain 16 resistances (M=128/8).

If the resistance ladder is to have a have a resistance of 100Ω, each parallel combination of primary resistance with 16 secondary resistances should be 12.5Ω(100Ω/8). If the primary resistances have a resistance of 15Ω, 75Ω in parallel with 15Ω will yield the necessary 12.5Ω. Each of the secondary resistances can then be 4.69Ω(75Ω/16).

Figure 10:
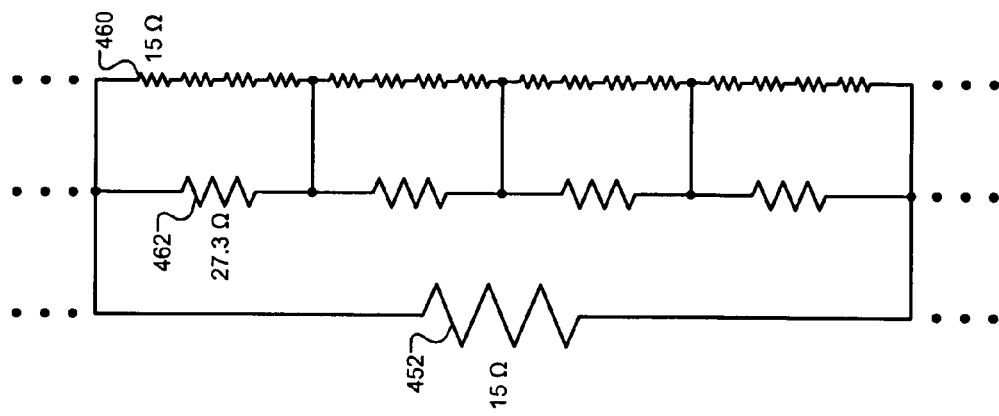
FIG. 10 is a functional circuit diagram of one component of a three-step segmented ladder network.

Referring now to FIG. 10, a three-step segmented ladder network is depicted. If resistances required by the two-step segmented network of FIG. 9, such as the example 4.69Ω resistances, are still too small to implement, tertiary segments can be added. A single exemplary parallel combination of main, secondary, and tertiary resistances is depicted in FIG. 10. Eight of these parallel combinations would achieve a resistance ladder with 128 total steps. The 15Ω resistance 452 of the main segment remains. A group of tertiary resistances 460 are placed in parallel with a single secondary resistance 462 and a group of these parallel combinations are placed in series with each other and in parallel with the primary resistance 452.

If each tertiary resistance is 15Ω, a group of four in series will be 60Ω. 60Ω in parallel with 27.3Ω yields 18.75Ω. Four of these 18.75Ω parallel combinations in series yield 75Ω. 75Ω in parallel with the 15Ω primary resistance yields 12.5Ω, which when repeated eight times gives the appropriate 100Ω total resistance ladder resistance. Segmenting of the resistances in this fashion can continue until the smallest resistance required is able to be fashioned in the current process technology.

Because the resistances are still relatively small in size, each main segment may be made using metal wiring. Depending upon the size of the secondary segments, they might still be made using poly resistance. The main resistance segments should be surrounded by other metal of the same material to guarantee equal metal thickness. This is even more important in a 65 nm process, as CMP (chemical-mechanical planarization) can easily cause metal thickness to vary along the main segment if metal density is not uniform. The metal resistance can be surrounded by placing it between calibration RAM and the comparator array, as depicted in FIG. 5. CMP dishing problems accumulate with each higher metal level, making metal 1 a desirable resistance material due to its uniformity. Using metal resistance, there is a good chance that secondary resistances will not be needed except to resolve the last two to three bits (divide by two or four only). Note that divide by one means no secondary resistances.

Figure 11:
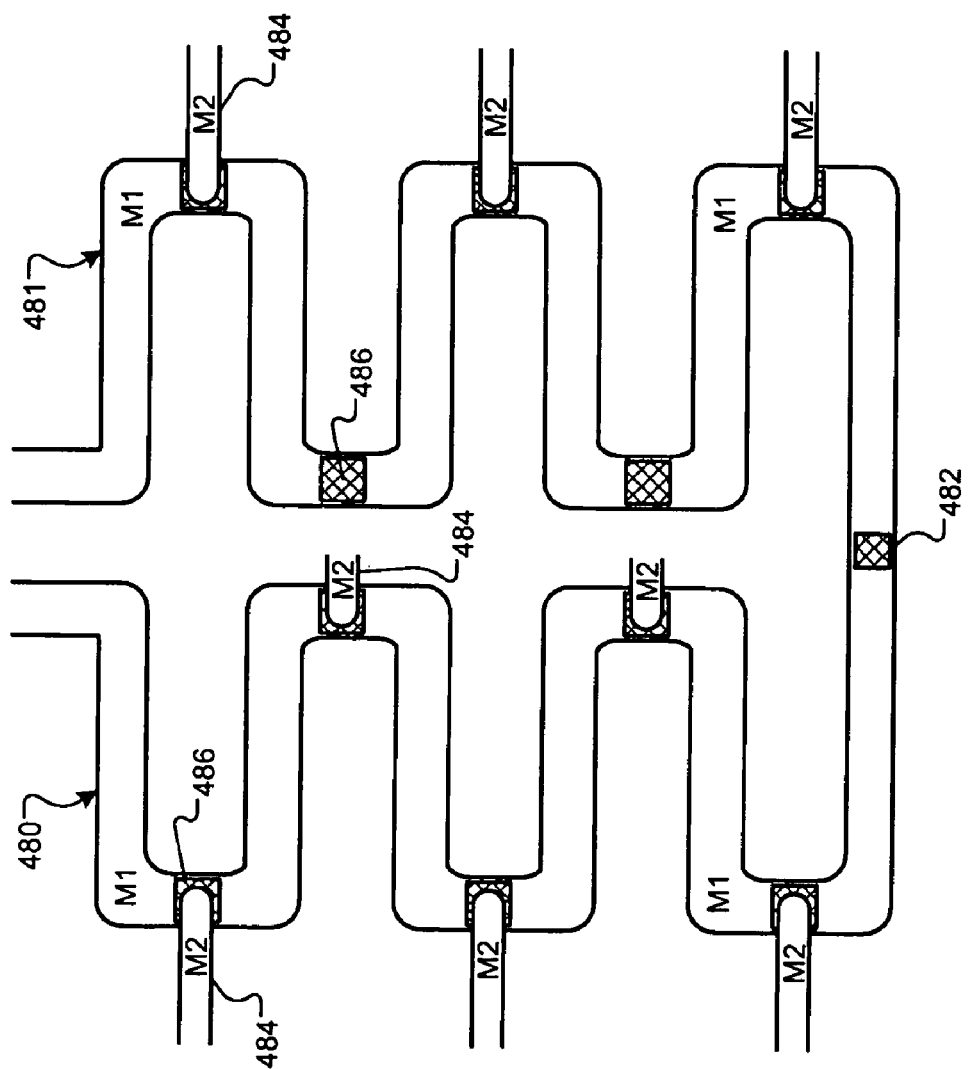
FIG. 11 is an exemplary layout of a resistance ladder.

Referring now to FIG. 11, an exemplary layout of a resistance ladder is presented. A first metal 1 trace 480, serving as resistance, is laid out in a folded shape to minimize the area required. A second metal 1 trace 481, in a folded configuration symmetrically identical to that of the first metal 1 trace 480, is located next to the first metal 1 trace 480. An end of the first metal 1 trace 480 is connected to an adjacent end of the second metal 1 trace 481. This connection point contains a contact square 482 for connection to an input amplifier. The contact square 482 is located in the middle of a metal one structure formed by the first and second metal 1 traces 480 and 481. The metal 1 traces 480 and 481 compose the two halves of a resistance ladder (such as the ladder resistances 230 and 232 of FIG. 3). Metal 2 traces 484 contact the metal 1 traces 480 and 481 at additional contact squares 486.

Figure 12B:
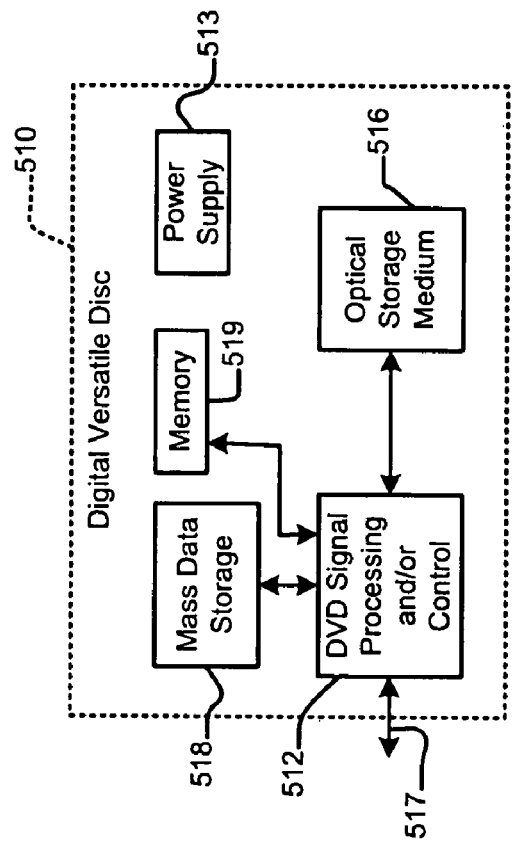
FIG. 12B is a functional block diagram of a digital versatile disk (DVD)
Figure 12A:
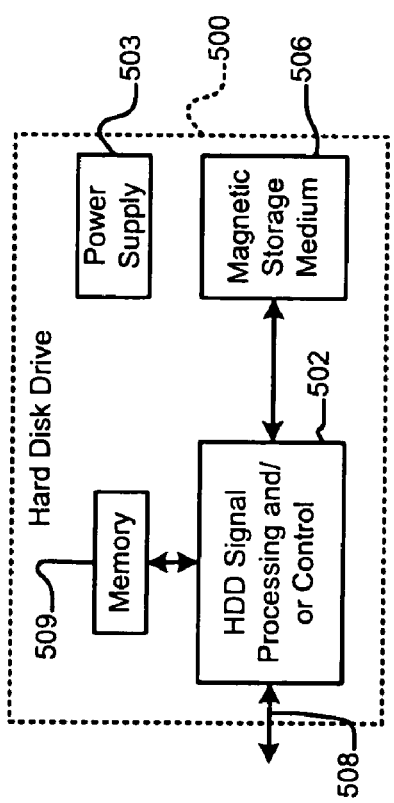
FIG. 12A is a functional block diagram of a hard disk drive.

Referring now to FIGS. 12A–12G, various exemplary implementations of the device are shown. Referring now to FIG. 12A, the device can be implemented in a hard disk drive 500. The device may implement and/or be implemented in analog to digital converters in either or both signal processing and/or control circuits and/or a power supply 503, which are generally identified in FIG. 12A at 502. In some implementations, the signal processing and/or control circuit 502 and/or other circuits (not shown) in the HDD 500 may process data, perform coding and/or encryption, perform calculations, and/or format data that is output to and/or received from a magnetic storage medium 506.

The HDD 500 may communicate with a host device (not shown) such as a computer, mobile computing devices such as personal digital assistants, cellular phones, media or MP3 players and the like, and/or other devices via one or more wired or wireless communication links 508. The HDD 500 may be connected to memory 509 such as random access memory (RAM), low latency nonvolatile memory such as flash memory, read only memory (ROM) and/or other suitable electronic data storage.

Referring now to FIG. 12B, the device can be implemented in a digital versatile disc (DVD) drive 510. The device may implement and/or be implemented in analog to digital converters in either or both signal processing and/or control circuits, which are generally identified in FIG. 12B at 512, mass data storage of the DVD drive 510 and/or a power supply 513. The signal processing and/or control circuit 512 and/or other circuits (not shown) in the DVD 510 may process data, perform coding and/or encryption, perform calculations, and/or format data that is read from and/or data written to an optical storage medium 516. In some implementations, the signal processing and/or control circuit 512 and/or other circuits (not shown) in the DVD 510 can also perform other functions such as encoding and/or decoding and/or any other signal processing functions associated with a DVD drive.

The DVD drive 510 may communicate with an output device (not shown) such as a computer, television or other device via one or more wired or wireless communication links 517. The DVD 510 may communicate with mass data storage 518 that stores data in a nonvolatile manner. The mass data storage 518 may include a hard disk drive (HDD). The HDD may have the configuration shown in FIG. 12A. The HDD may be a mini HDD that includes one or more platters having a diameter that is smaller than approximately 1.8". The DVD 510 may be connected to memory 519 such as RAM, ROM, low latency nonvolatile memory such as flash memory and/or other suitable electronic data storage.

Figure 12D:
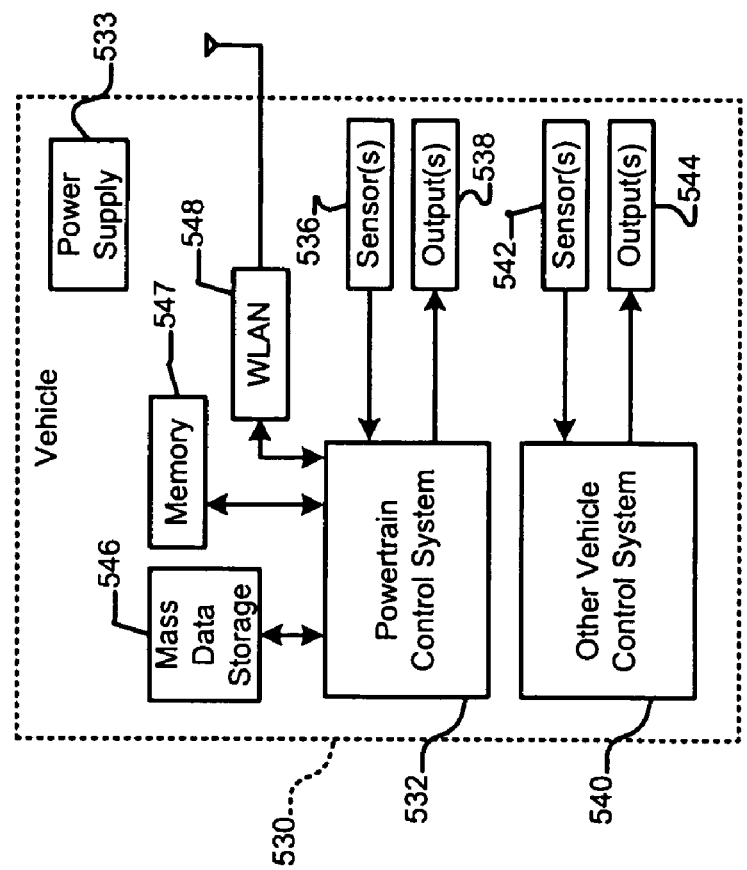
FIG. 12D is a functional block diagram of a vehicle control system.
Figure 12C:
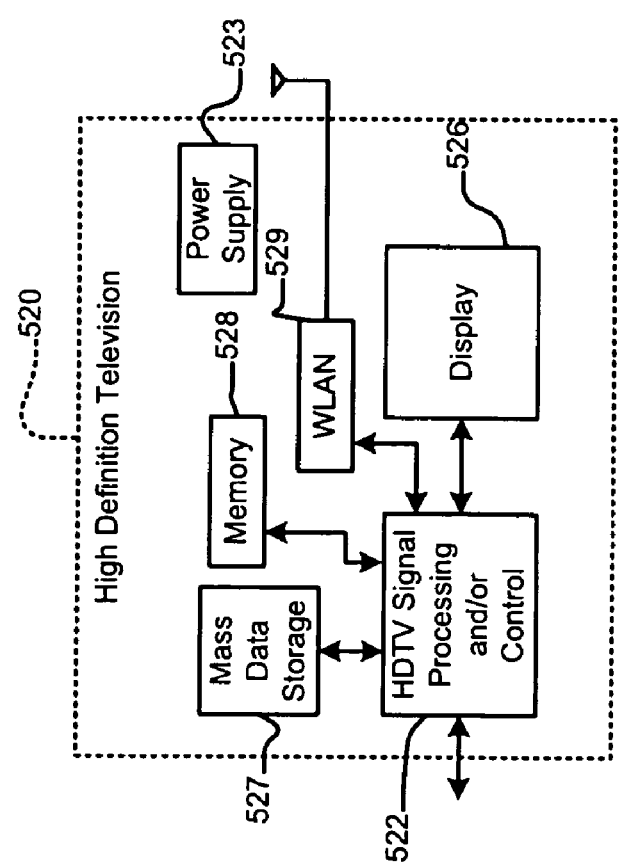
FIG. 12C is a functional block diagram of a high definition television.

Referring now to FIG. 12C, the device can be implemented in a high definition television (HDTV) 520. The device may implement and/or be implemented in analog to digital converters in either or both signal processing and/or control circuits, which are generally identified in FIG. 12E at 522, a WLAN interface, mass data storage of the HDTV 520 and/or a power supply 523. The HDTV 520 receives HDTV input signals in either a wired or wireless format and generates HDTV output signals for a display 526. In some implementations, signal processing circuit and/or control circuit 522 and/or other circuits (not shown) of the HDTV 520 may process data, perform coding and/or encryption, perform calculations, format data and/or perform any other type of HDTV processing that may be required.

The HDTV 520 may communicate with mass data storage 527 that stores data in a nonvolatile manner such as optical and/or magnetic storage devices. At least one HDD may have the configuration shown in FIG. 12A and/or at least one DVD may have the configuration shown in FIG. 12B. The HDD may be a mini HDD that includes one or more platters having a diameter that is smaller than approximately 1.8". The HDTV 520 may be connected to memory 528 such as RAM, ROM, low latency nonvolatile memory such as flash memory and/or other suitable electronic data storage. The HDTV 520 also may support connections with a WLAN via a WLAN network interface 529.

Referring now to FIG. 12D, the device may implement and/or be implemented in analog to digital converters in a control system of a vehicle 530, a WLAN interface, mass data storage of the vehicle control system and/or a power supply 533. In some implementations, the device implement a powertrain control system 532 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The device may also be implemented in other control systems 540 of the vehicle 530. The control system 540 may likewise receive signals from input sensors 542 and/or output control signals to one or more output devices 544. In some implementations, the control system 540 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 532 may communicate with mass data storage 546 that stores data in a nonvolatile manner. The mass data storage 546 may include optical and/or magnetic storage devices for example hard disk drives HDD and/or DVDs. At least one HDD may have the configuration shown in FIG. 12A and/or at least one DVD may have the configuration shown in FIG. 12B. The HDD may be a mini HDD that includes one or more platters having a diameter that is smaller than approximately 1.8".

The powertrain control system 532 may be connected to memory 547 such as RAM, ROM, low latency nonvolatile memory such as flash memory and/or other suitable electronic data storage. The powertrain control system 532 also may support connections with a WLAN via a WLAN network interface 548. The control system 540 may also include mass data storage, memory and/or a WLAN interface (all not shown).

Figure 12E:
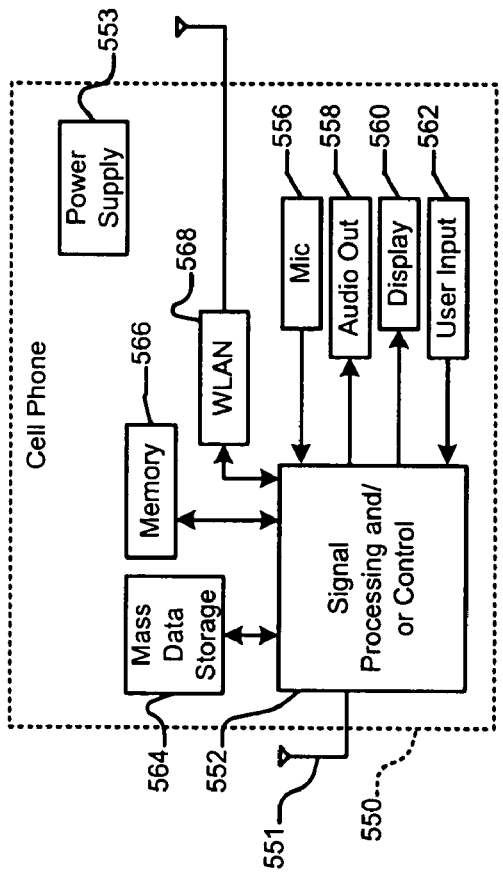
FIG. 12E is a functional block diagram of a cellular phone.

Referring now to FIG. 12E, the device can be implemented in a cellular phone 550 that may include a cellular antenna 551. The device may implement and/or be implemented in analog to digital converters in either or both signal processing and/or control circuits, which are generally identified in FIG. 12E at 552, a WLAN interface, mass data storage of the cellular phone 550 and/or a power supply 553.] In some implementations, the cellular phone 550 includes a microphone 556, an audio output 558 such as a speaker and/or audio output jack, a display 560 and/or an input device 562 such as a keypad, pointing device, voice actuation and/or other input device. The signal processing and/or control circuits 552 and/or other circuits (not shown) in the cellular phone 550 may process data, perform coding and/or encryption, perform calculations, format data and/or perform other cellular phone functions.

The cellular phone 550 may communicate with mass data storage 564 that stores data in a nonvolatile manner such as optical and/or magnetic storage devices for example hard disk drives HDD and/or DVDs. At least one HDD may have the configuration shown in FIG. 12A and/or at least one DVD may have the configuration shown in FIG. 12B. The HDD may be a mini HDD that includes one or more platters having a diameter that is smaller than approximately 1.8". The cellular phone 550 may be connected to memory 566 such as RAM, ROM, low latency nonvolatile memory such as flash memory and/or other suitable electronic data storage. The cellular phone 550 also may support connections with a WLAN via a WLAN network interface 568.

Figure 12F:
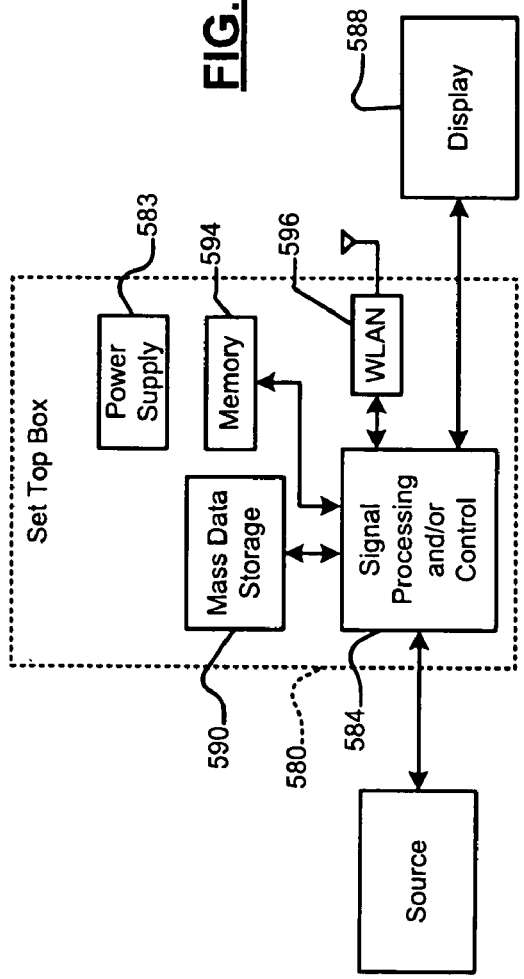
FIG. 12F is a functional block diagram of a set top box.

Referring now to FIG. 12F, the device can be implemented in a set top box 580. The device may implement and/or be implemented in analog to digital converters in either or both signal processing and/or control circuits, which are generally identified in FIG. 12F at 584, a WLAN interface, mass data storage of the set top box 580 and/or a power supply 583. The set top box 580 receives signals from a source such as a broadband source and outputs standard and/or high definition audio/video signals suitable for a display 588 such as a television and/or monitor and/or other video and/or audio output devices. The signal processing and/or control circuits 584 and/or other circuits (not shown) of the set top box 580 may process data, perform coding and/or encryption, perform calculations, format data and/or perform any other set top box function.

The set top box 580 may communicate with mass data storage 590 that stores data in a nonvolatile manner. The mass data storage 590 may include optical and/or magnetic storage devices for example hard disk drives HDD and/or DVDs. At least one HDD may have the configuration shown in FIG. 12A and/or at least one DVD may have the configuration shown in FIG. 12B. The HDD may be a mini HDD that includes one or more platters having a diameter that is smaller than approximately 1.8". The set top box 580 may be connected to memory 594 such as RAM, ROM, low latency nonvolatile memory such as flash memory and/or other suitable electronic data storage. The set top box 580 also may support connections with a WLAN via a WLAN network interface 596.

Figure 12G:
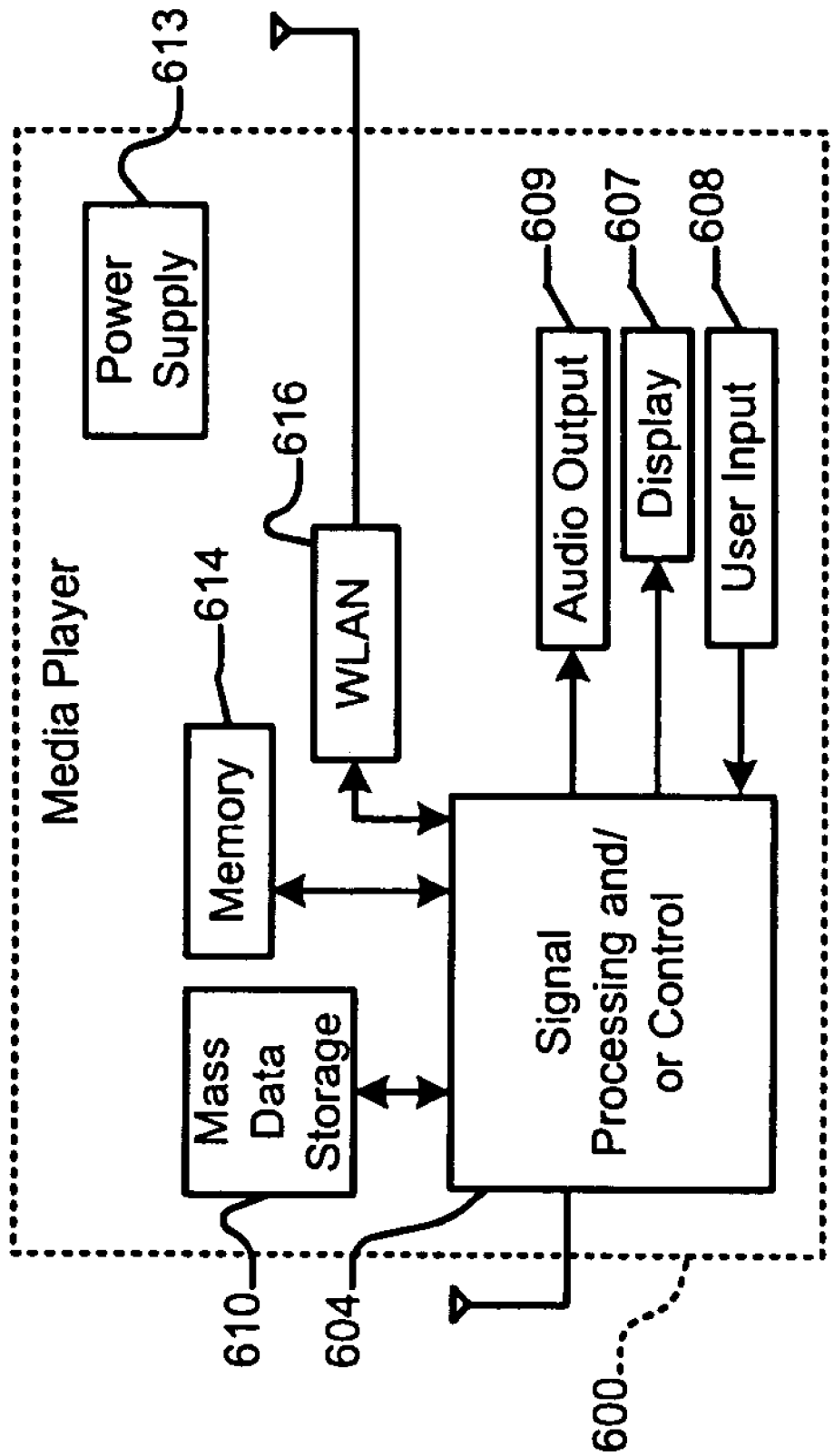
FIG. 12G is a functional block diagram of a media player.

Referring now to FIG. 12G, the device can be implemented in a media player 600. The device may implement and/or be implemented in analog to digital converters in either or both signal processing and/or control circuits, which are generally identified in FIG. 12G at 604, a WLAN interface, mass data storage of the media player 600 and/or a power supply 603.] In some implementations, the media player 600 includes a display 607 and/or a user input 608 such as a keypad, touchpad and the like. In some implementations, the media player 600 may employ a graphical user interface (GUI) that typically employs menus, drop down menus, icons and/or a point-and-click interface via the display 607 and/or user input 608. The media player 600 further includes an audio output 609 such as a speaker and/or audio output jack. The signal processing and/or control circuits 604 and/or other circuits (not shown) of the media player 600 may process data, perform coding and/or encryption, perform calculations, format data and/or perform any other media player function.

The media player 600 may communicate with mass data storage 610 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 12A and/or at least one DVD may have the configuration shown in FIG. 12B. The HDD may be a mini HDD that includes one or more platters having a diameter that is smaller than approximately 1.8". The media player 600 may be connected to memory 614 such as RAM, ROM, low latency nonvolatile memory such as flash memory and/or other suitable electronic data storage. The media player 600 also may support connections with a WLAN via a WLAN network interface 616. Still other implementations in addition to those described above are contemplated.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A differential analog to digital converter (ADC) comprising:
 a first resistance ladder leg including two resistances having first ends that communicate with a middle node and second ends that communicate with a current source;
 a second resistance ladder leg including two resistances having first ends that communicate with a middle node and second ends that communicate with a current source;
 a first amplifier that applies a voltage based upon a first phase of an input signal to said middle node of said first resistance ladder leg;
 a second amplifier that applies a voltage based upon a second phase of the input signal to said middle node of said second resistance ladder leg; and
 a plurality of comparators, each having first and second inputs, wherein said first input communicates with one of said two resistances of said first resistance ladder leg, and said second input communicates with one of said two resistances of said second resistance ladder leg.

2. The ADC of claim 1 wherein each of said plurality of comparators are calibrated.

3. The ADC of claim 2 wherein said current sources of said first and second resistance ladder legs are turned off during calibration.

4. The ADC of claim 3 wherein said first and second amplifiers output voltages based upon an input signal that is substantially equal to zero during calibration.

5. The ADC of claim 2 wherein each of said plurality of comparators includes an adjustable current source that is adjusted based upon a respective digital value.

6. The ADC of claim 5 wherein said respective digital values are determined during calibration.

7. The ADC of claim 6 further comprising a control module that, during calibration, varies said respective digital values based upon outputs of said plurality of comparators.

8. The ADC of claim 1 wherein said first and second amplifiers include transimpedance amplifiers.

9. The ADC of claim 1 wherein said first and second amplifiers include nested transimpedance amplifiers.

10. The ADC of claim 1 wherein each of said resistances of said first and second resistance ladder legs comprises N individual resistances, wherein N is an integer greater than one.

11. The ADC of claim 10 wherein said individual resistances have substantially equal resistance values.

12. The ADC of claim 1 wherein said resistances of said first resistance ladder legs comprise N individual resistances connected in series.

13. The ADC of claim 1 wherein said resistances of said first resistance ladder leg comprise a plurality of primary resistances connected in series and groups of secondary resistances connected in parallel with each of said primary resistances.

14. The ADC of claim 1 wherein said resistances of said first resistance ladder leg comprise a plurality of primary resistances connected in series, groups of secondary resistances connected in parallel with each of said primary resistances, and groups of tertiary resistances connected in parallel with each of said secondary resistances.

15. The ADC of claim 1 wherein said resistances of said first resistance ladder leg comprise N individual resistances.

16. The ADC of claim 15 wherein said first inputs of said comparators communicate with a connection between two of said N individual resistances of said first resistance ladder leg, and said second inputs communicate with a connection between two of said individual resistances of said second resistance ladder leg.

17. The ADC of claim 1 wherein said first and second inputs of said plurality of comparators experience a propagation delay based upon an electrical distance of said first and second inputs from a corresponding one of said middle nodes.

18. The ADC of claim 17 further comprising delay elements that communicate with said first and second inputs of said comparators and that create substantially identical aggregate delays from corresponding ones of said middle nodes to said first and second inputs of said comparators.

19. The ADC of claim 18 wherein said delay elements comprise resistive traces.

20. The ADC of claim 18 wherein said delay elements comprise transistors.

21. The ADC of claim 17 further comprising a plurality of latching devices each corresponding to one of said plurality of comparators.

22. The ADC of claim 21 wherein said plurality of latching devices latch an output from a corresponding one of said plurality of comparators at a delayed time based upon a propagation delay at at least one of first and second inputs of said corresponding one of said plurality of comparators.

23. The ADC of claim 22 further comprising a decoding module that reads outputs of said plurality of latching devices substantially simultaneously after a last one of said plurality of latching devices is actuated.

24. The ADC of claim 1 wherein said ADC is implemented on an integrated circuit having a first metal layer, and wherein said first and second resistance ladder legs are implemented in said first metal layer.

25. The ADC of claim 24 wherein said two resistances of said first resistance ladder leg are connected at said middle node, and are laid out as mirror images of each other, and wherein said two resistances of said second resistance ladder leg are connected at said middle node, and are laid out as mirror images of each other.

26. The ADC of claim 25 wherein each of said resistances of both said first and second resistance ladder legs is laid out in a folded shape to minimize area.

27. A method for converting from analog to digital comprising:
   providing a first resistance ladder leg including two resistances having first ends that communicate with a middle node and second ends that communicate with a current source;
   providing a second resistance ladder leg including two resistances having first ends that communicate with a middle node and second ends that communicate with a current source;
   applying a voltage based upon a first phase of an input signal to said middle node of said first resistance ladder leg;
   applying a voltage based upon a second phase of the input signal to said middle node of said second resistance ladder leg; and
   providing a plurality of comparators, each having first and second inputs, wherein said first input communicates with one of said two resistances of said first resistance ladder leg, and said second input communicates with one of said two resistances of said second resistance ladder leg.

28. The method of claim 27 further comprising calibrating said plurality of comparators.

29. The method of claim 28 further comprising turning off said current sources of said first and second resistance ladder legs during calibration.

30. The method of claim 29 further comprising setting the input signal substantially equal to zero during calibration.

31. The method of claim 28 further comprising adjusting a current source for each of said plurality of comparators based upon a respective digital value.

32. The method of claim 31 further comprising determining said respective digital values during calibration.

33. The method of claim 32 further comprising varying said respective digital values based upon outputs of said plurality of comparators.

34. The method of claim 27 further comprising creating delays from corresponding ones of said middle nodes to said first and second inputs of said comparators that are substantially identical for each of said comparators.

35. The method of claim 27 further comprising latching an output from a corresponding one of said plurality of comparators at a delayed time based upon a propagation delay at at least one of first and second inputs of said corresponding one of said plurality of comparators.

36. The method of claim 35 further comprising reading latched outputs substantially simultaneously after a last latching event.

* * * * *

UNITED STATES PATENT AND TRADEMARK OFFICE
CERTIFICATE OF CORRECTION

PATENT NO. : 7,212,144 B1  Page 1 of 1
APPLICATION NO. : 11/384855
DATED : May 1, 2007
INVENTOR(S) : Sehat Sutardja It is certified that error appears in the above-identified patent and that said Letters Patent is hereby corrected as shown below:

| | |
|---|---|
| Column 11, Line 3 | Delete "desires" and insert --desired-- |
| Column 13, Line 34 | Delete second occurrence of "have a" |
| Column 16, Line 16 | Delete "]" after "553." |
| Column 17, Line 7 | Delete "]" after "603." |

Signed and Sealed this

Twenty-fourth Day of July, 2007

JON W. DUDAS
*Director of the United States Patent and Trademark Office*